United States Patent
Ruby et al.

(10) Patent No.: US 6,777,267 B2
(45) Date of Patent: Aug. 17, 2004

(54) DIE SINGULATION USING DEEP SILICON ETCHING

(75) Inventors: Richard C. Ruby, Menlo Park, CA (US); Frank S. Geefay, Cupertino, CA (US); Cheol Hyun Han, Fremont, CA (US); Qing Gan, Fremont, CA (US); Andrew T. Barfknecht, Menlo Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/286,729

(22) Filed: Nov. 1, 2002

(65) Prior Publication Data

US 2004/0087059 A1 May 6, 2004

(51) Int. Cl.[7] .................... H01L 21/44; H01L 21/48; H01L 21/50
(52) U.S. Cl. ........................ 438/113; 438/460
(58) Field of Search .................. 438/113, 459, 438/460, 665, 964

(56) References Cited

U.S. PATENT DOCUMENTS 6,517,736 B1 * 2/2003 Flannery et al. .............. 216/33
6,541,352 B2 * 4/2003 Wachtler .................... 438/460

* cited by examiner

Primary Examiner—Phuc T. Dang

(57) ABSTRACT

A method for separating dies on a wafer includes etching channels around the dies on a first side of the wafer, mounting the first side of the wafer to a quartz plate with an UV adhesive, and grinding a second side of the wafer until the channels are exposed on the second side of the wafer. At this point, the dies are separated but held together by the UV adhesive on the quartz plate. The method further includes mounting a second side of the wafer to a tack tape, exposing UV radiation through the quartz plate to the UV adhesive. At this point, the UV adhesive looses its adhesion so the dies are held together by the tack tape. The method further includes dismounting the quartz plate from the first side of the wafer and picking up the individual dies from the tack tape.

19 Claims, 9 Drawing Sheets

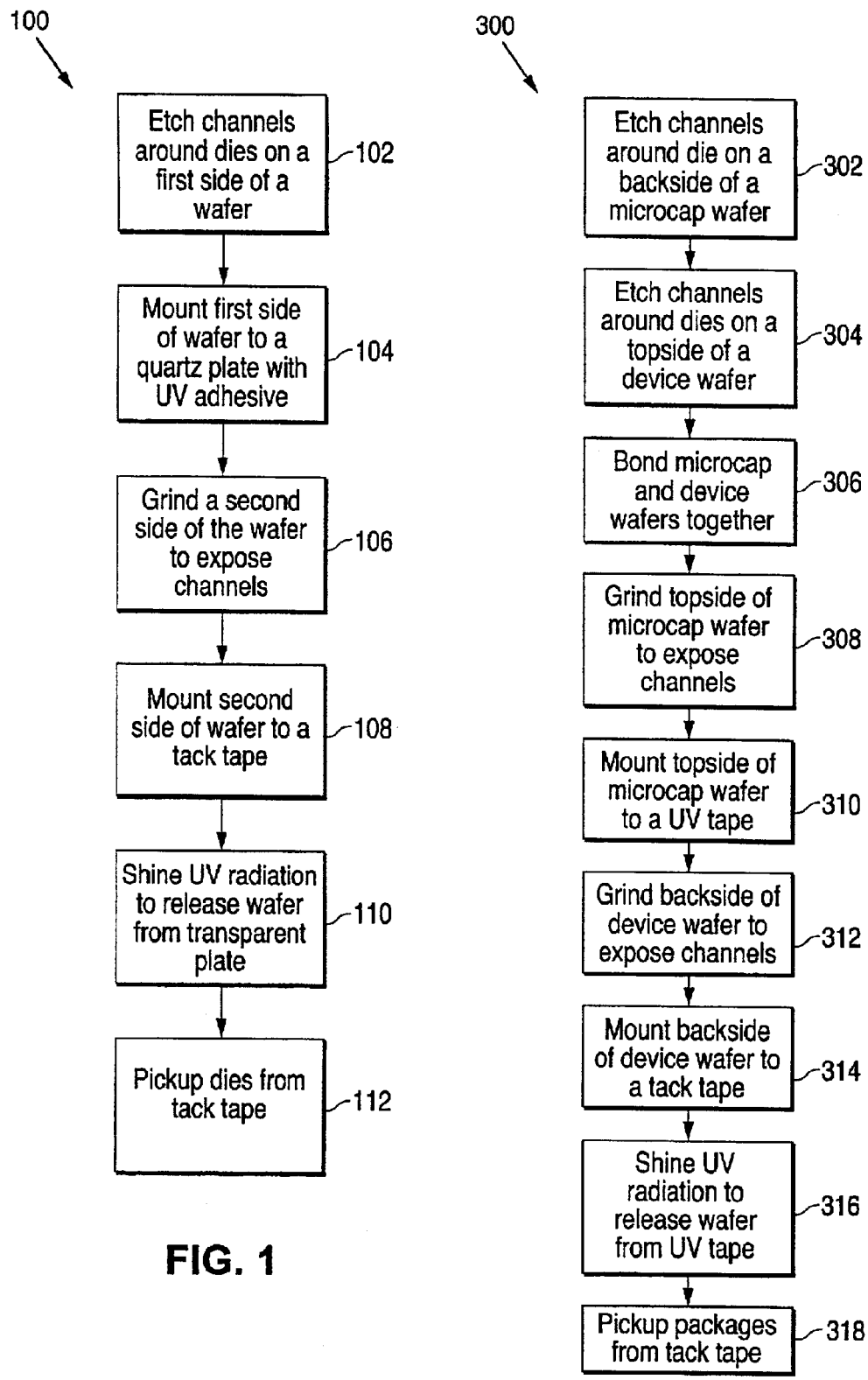

DIE SINGULATION USING DEEP SILICON ETCHING

FIELD OF INVENTION

This invention relates to a method for separating dies on a wafer.

DESCRIPTION OF RELATED ART

Currently wafers are diced using a scribe and break technique or a semiconductor-dedicated saw. Scribe and break technique uses a diamond scribe to create scribe marks in the alleys (i.e., scribe streets) between dies on a wafer. A special "breaking tool"—typically an anvil above a doctor blade—snaps the wafer into discrete dies.

Dicing using a saw requires the wafer to be placed on a tape that is stretched taut across a round hoop. The hoop and the wafer are loaded into the saw and the circular spinning blade is moved back and forth to cut the alleys between the dies.

The width of the alley necessary to accommodate the scribe or the saw is about 100 microns. If the active area on a die is 160,000 square microns (400 microns on a side), then the total area of the die including the 50 micron alley around each die is 250,000 square microns, or a 57% increase over the total active area. If a 10 micron alley is added around the die, then the total die area becomes 168,100 square microns, or a 5.1% increase in area. The difference between a 100 micron alley and a 10 micron alley gives approximately 33% saving in area. Thus 33% more die can be produced on the same wafer.

Thus, what is needed is a method to separate dies on a wafer using smaller alleys.

SUMMARY OF THE INVENTION

In one embodiment of the invention, a method for separating dies on a wafer structure includes forming channels around the dies on a first side of the wafer structure, mounting the first side of the wafer structure to a plate having a first adhesive, and removing material from a second side of the wafer structure until the channels are exposed on the second side of the wafer structure. At this point, the dies are separated but held together by the first adhesive on the plate. The method further includes mounting a second side of the wafer structure to a second adhesive and dismounting the plate from the first side of the wafer structure. In one embodiment, the plate is dismounted by exposing UV radiation through the plate to the first adhesive so the first adhesive looses its adhesion to the wafer structure. At this point, the dies are held together by the second adhesive. The method further includes picking up the individual dies from the second adhesive.

BRIEF DESCRIPTION OF THE DRAWINGS

FIG. 1 illustrates a method to separate dies on a wafer structure in one embodiment of the invention.

FIG. 3 illustrates a method to separate microcap wafer-level packages on a wafer structure in one embodiment of the invention.

DETAILED DESCRIPTION

In embodiments of the invention, a deep silicon etch is performed on a first side of a wafer to form channels around dies on the wafer. The wafer is then mounted on the first side to a UV transparent plate with an UV adhesive or tape. A second side of the wafer is grinded to a depth that exposes the channels and thereby singulating (i.e., separating) the dies. The wafer is then mounted on the second side to a tack tape. UV radiation is shone through the transparent plate to cause the UV adhesive to release the wafer from the transparent plate. The dies are then picked up from the tack tape.

Figure 2A:
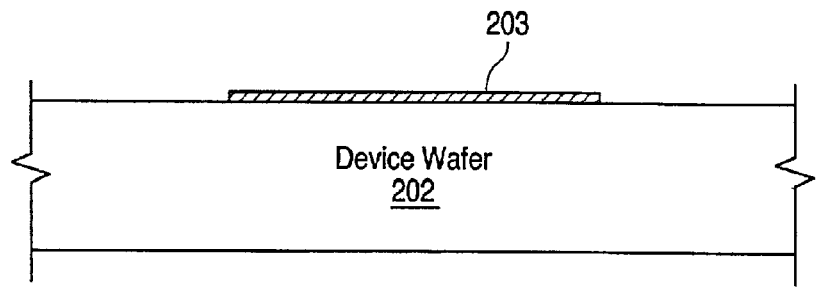
FIGS. 2A, 2B, 2C, 2D, 2E, and 2F illustrate cross-sections of a wafer structure being singulated by the method of FIG. 1.

FIG. 1 illustrates a method 100 to separate dies on a wafer structure in one embodiment of the invention. Method 100 starts with a wafer structure 202 shown partially in FIG. 2A. Wafer structure 202 is a semiconductor wafer to be divided into dies having devices such as an FBAR (film bulk acoustic resonators) device 203 (only one shown).

Figure 2B:
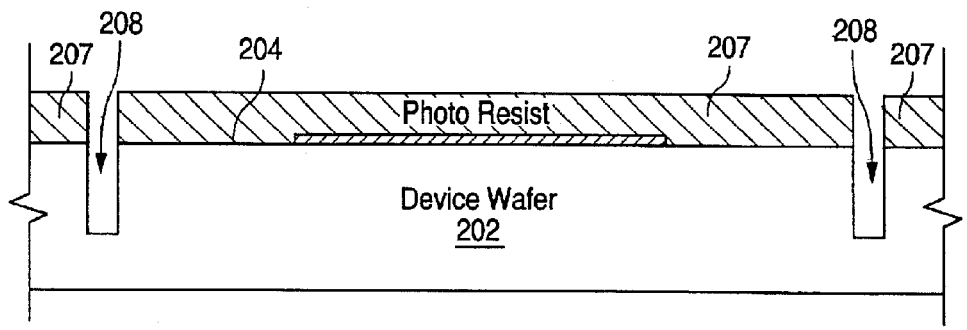

In action 102, channels 208 are formed around the dies on topside 204 of wafer 202 as shown in FIG. 2B. In one embodiment, channels 208 are defined by photoresist 207 and then formed by deep reactive ion etching (DRIE) using the "Bosch process." The width and depth of channels 208 can be varied to suit the application. In one embodiment, the width of a channel 208 between adjacent dies ranges from 10 to 20 microns. After channels 208 are etched, photoresist 207 is removed.

Figure 2C:
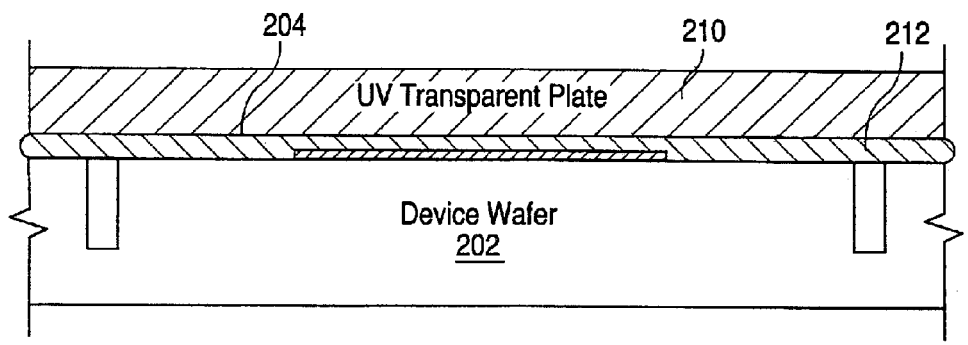

In action 104, topside 204 of wafer 202 is mounted to a transparent plate 210 by an adhesive 212 as shown in FIG. 2C. Plate 210 is used to handle and support wafer 202 for further processing. In one embodiment, plate 210 is a quartz plate and adhesive 212 is a conventional UV-releasable adhesive or UV-releasable tape such as "SP-589M-130" from Furukawa Electronic, Co., Ltd. of Japan.

Figure 2D:
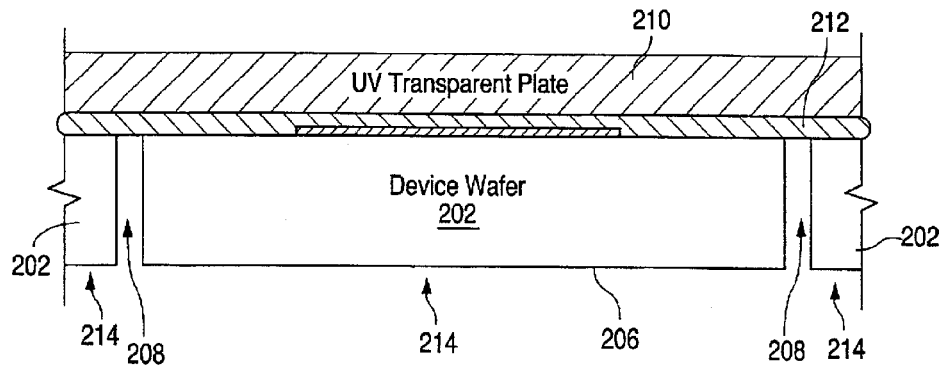

In action 106, the material from backside 206 of wafer 202 is removed to expose channels 208 on backside 206 as shown in FIG. 2D. Once channels 208 are exposed on backside 206, dies 214 are separated but held together by adhesive 212 on plate 210. In one embodiment, conventional mechanical grinding is used to remove material from backside 206 to a depth that exposes channels 208. Plate 210 and adhesive 212 provide the proper support during the grinding process.

Figure 2E:
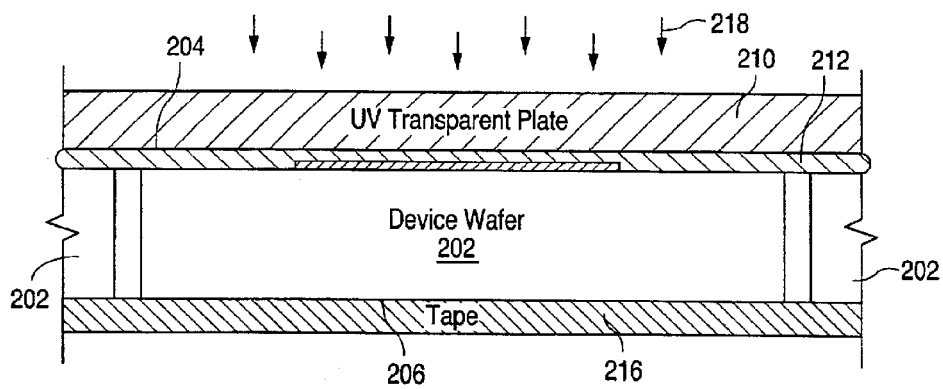

In action 108, backside 206 of wafer 202 is mounted to a tape 216 as shown in FIG. 2E. In one embodiment, tape 216 is a conventional tack tape such as "Blue Low Tack" or "Blue Medium Tack" made by Semiconductor Equipment Corp. of Moorpark, Calif.

Figure 2F:
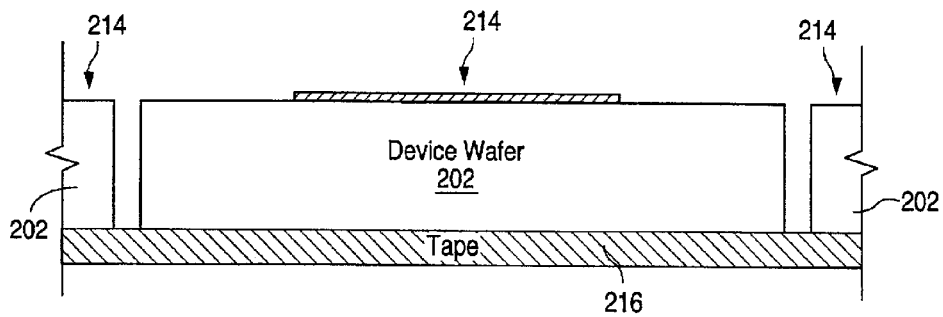

In action 110, topside 204 of wafer 202 is exposed to UV radiation 218 as shown in FIG. 2E. UV radiation 218 passes through plate 210 and causes adhesive 212 to lose its adhesion to topside 204. As shown in FIG. 2F, dies 214 become released from plate 210 but are held together by tape 216.

In action 112, dies 214 are picked up from tape 216. In one embodiment, tape 216 is stretched to increase the space between dies 214. Eject pins push up through tape 216 to elevate and loosen dies 214 from tape 216. A vacuum driven pickup device then retrieves dies 214 and deposits them in a carrier.

The method described above can be modified for application to microcap wafer-level packages formed with bonded wafers.

Figure 4A:
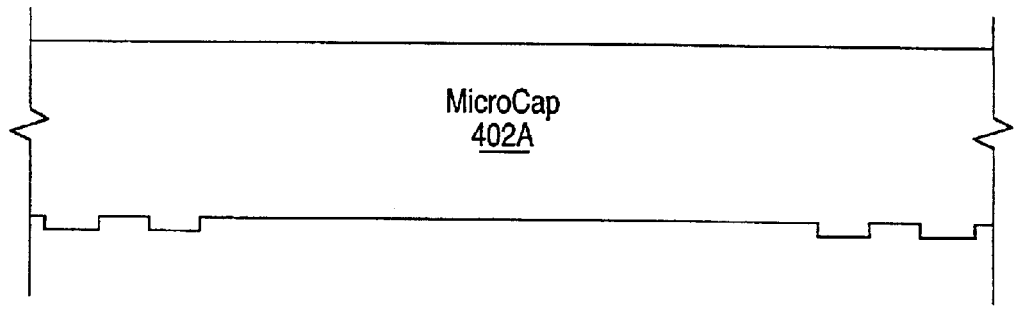
FIGS. 4A, 4B, 4C, 4D, 4E, 4F, 4G, 4H, 4I, and 4J illustrate cross-sections of a wafer structure being singulated by the method of FIG. 3.

FIG. 3 illustrates a method 300 to separate dies, such as microcap wafer-level packages, on a wafer structure in one embodiment of the invention. Method 300 starts with a microcap wafer 402A shown partially in FIG. 4A, and a device wafer 402B shown partially in FIG. 4C. Microcap wafer 402A consists of dies to be divided into the microcaps of the microcap wafer-level package (hereafter "microcap dies"). Device wafer 402B consists of dies with FBAR devices 403 (only one shown) to be divided into the bases of the microcap wafer-level package (hereafter "base dies").

Figure 4B:
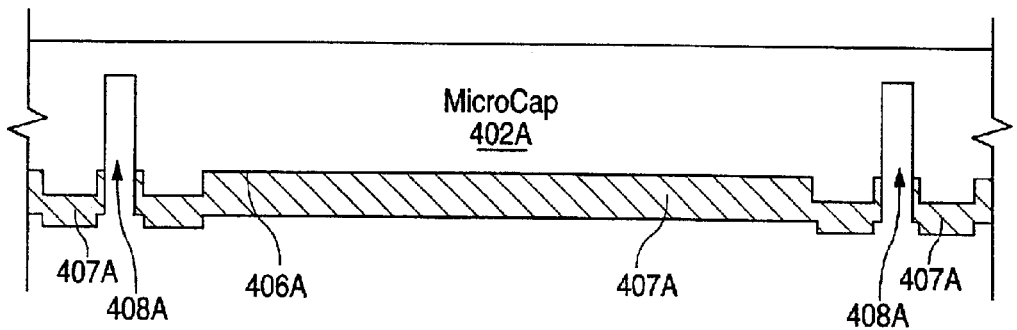
Figure 4C:
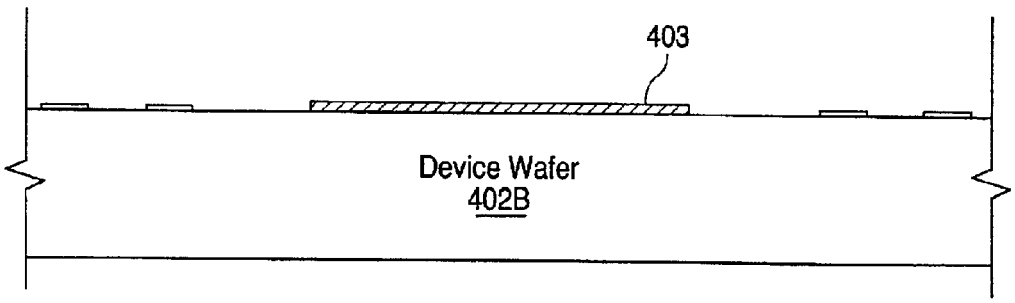

In action 302, channels 408A are formed around the microcap dies on underside 406A of microcap wafer 402A as shown in FIG. 4B. In one embodiment, channels 408A are defined by photoresist 407A and then formed by DRIE using the "Bosch process." The width and depth of channels 408A can be varied to suit the application. In one embodiment, the width of a channel 408A between adjacent dies ranges from 10 to 20 microns. After channels 408A are etched, photoresist 407A is removed.

Figure 4D:
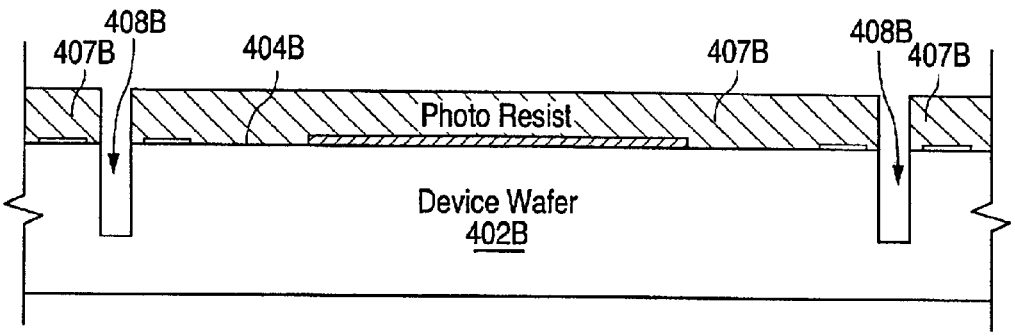

In action 304, channels 408B are formed around the base dies on topside 404B of device wafer 402B as shown in FIG. 4D. In one embodiment, channels 408B are defined by photoresist 407B and then formed by DRIE. The width and depth of channels 408B can be varied to suit the application. In one embodiment, the width of a channel 408B between adjacent dies ranges from 10 to 20 microns. After channels 408B are etched, photoresist 407B is removed.

Figure 4E:
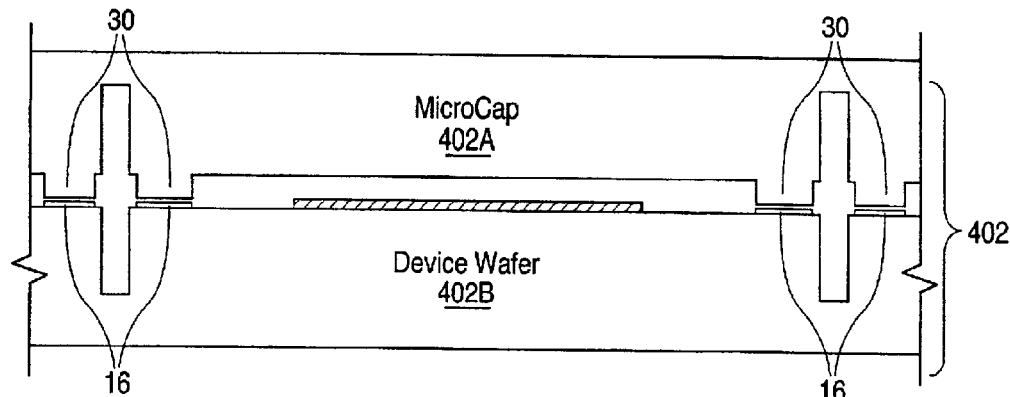

In action 306, microcap wafer 402A and device wafer 402B are bonded to form a wafer structure 402 shown partially in FIG. 4E. Specifically, gasket 30 on microcap wafer 402A are bonded with peripheral pads 16 on device wafer 402B.

Figure 4F:
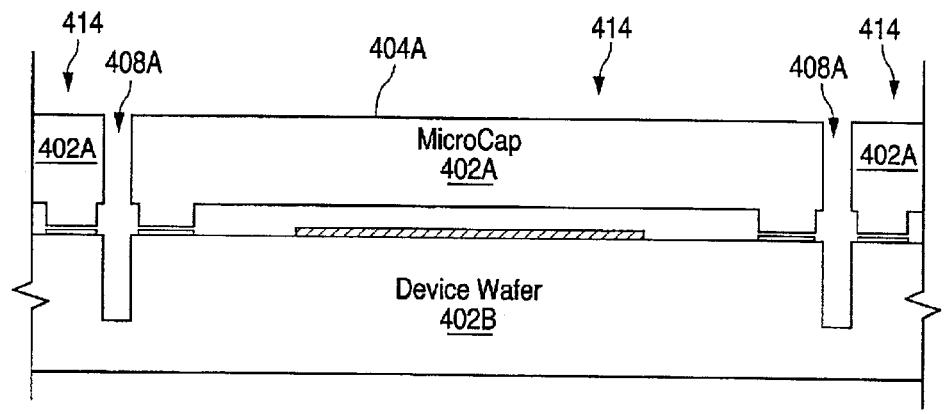

In action 308, the material from topside 404A of microcap wafer 402A is removed to expose channels 408A on topside 404A as shown in FIG. 4F. Once channels 408A are exposed on topside 408A, microcap dies are separated but held together by device wafer 402B. In one embodiment, conventional mechanical grinding is used to remove material from topside 404A to a depth that exposes channels 408A. Device wafer 402B provides the proper support during the grinding process.

Figure 4G:
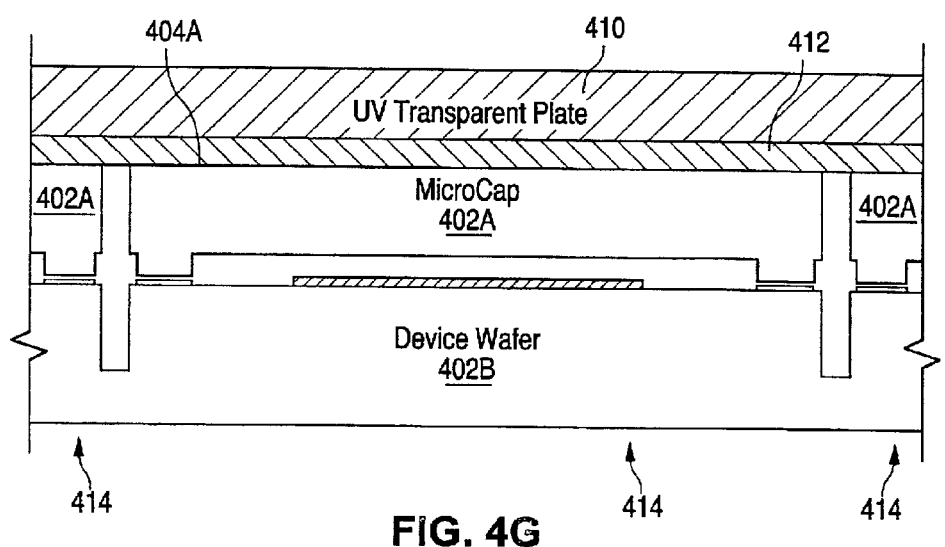

In action 310, topside 404A of microcap wafer 402A is mounted to a transparent plate 410 by an adhesive 412 as shown in FIG. 4G. Plate 410 is used to handle and support packages 414 for further processing. In one embodiment, plate 410 is a quartz plate and adhesive 412 is a conventional UV-releasable adhesive or UV-releasable tape.

Figure 4H:
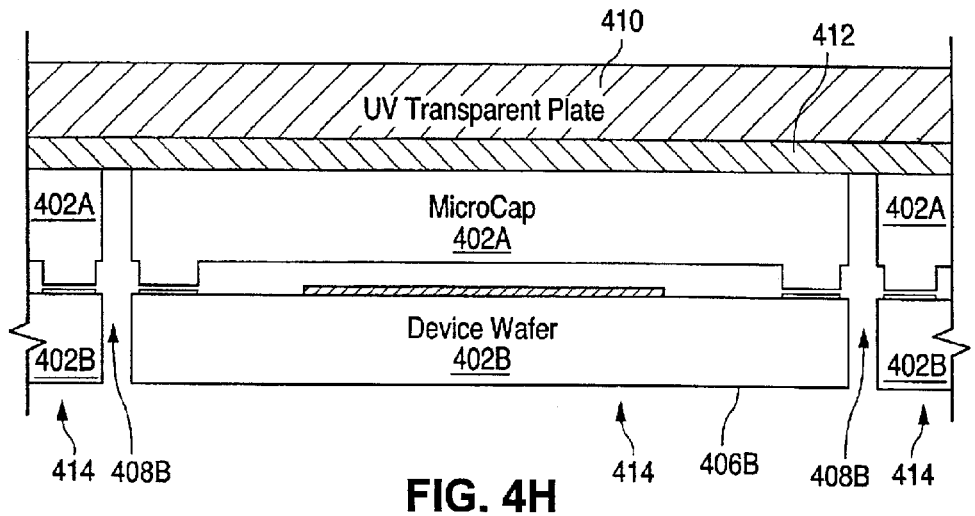

In action 312, the material from backside 406B of wafer 402B is removed to expose channels 408B on backside 406B as shown in FIG. 4H. Once channels 408B are exposed on backside 406B, packages 414 are separated but held together by adhesive 412 on plate 410. In one embodiment, conventional mechanical grinding is used to remove material from backside 406B to a depth that exposes channels 408B. Plate 410 and adhesive 412 provide the proper support during the grinding process.

Figure 4I:
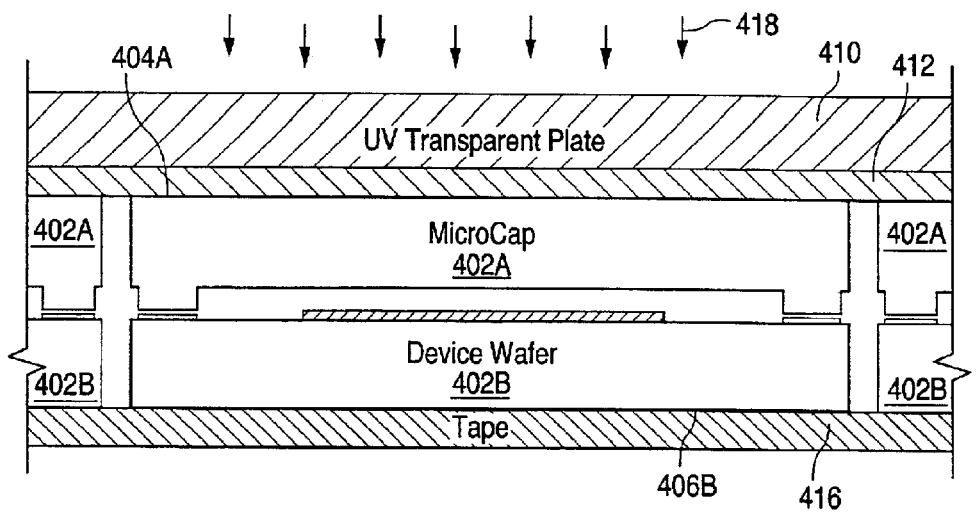

In action 314, backside 406B of wafer 402B is mounted to a tape 416 as shown in FIG. 4I. In one embodiment, tape 416 is a conventional tack tape.

Figure 4J:
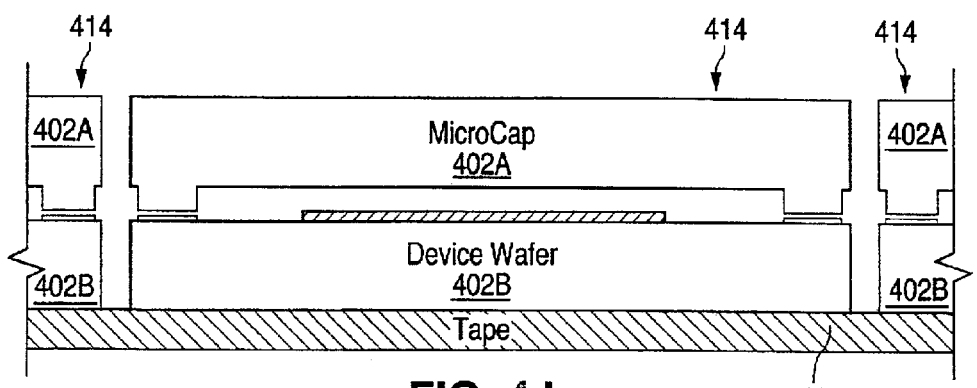

In action 316, topside 404A of microcap wafer 402A is exposed to UV radiation 418 as shown in FIG. 4I. UV radiation 418 passes through plate 410 and causes adhesive 412 to loose its adhesion to topside 404A of microcap wafer 402A. As shown in FIG. 4J, packages 414 become released from plate 410 but are held together by tape 416.

In action 318, packages 414 are picked up from tape 416. In one embodiment, tape 416 is stretched to increase the space between packages 414. Eject pins push up through tape 416 to elevate and loosen packages 414 from tape 416. A vacuum driven pickup device then retrieves packages 414 and deposits them in a carrier.

Figure 5:
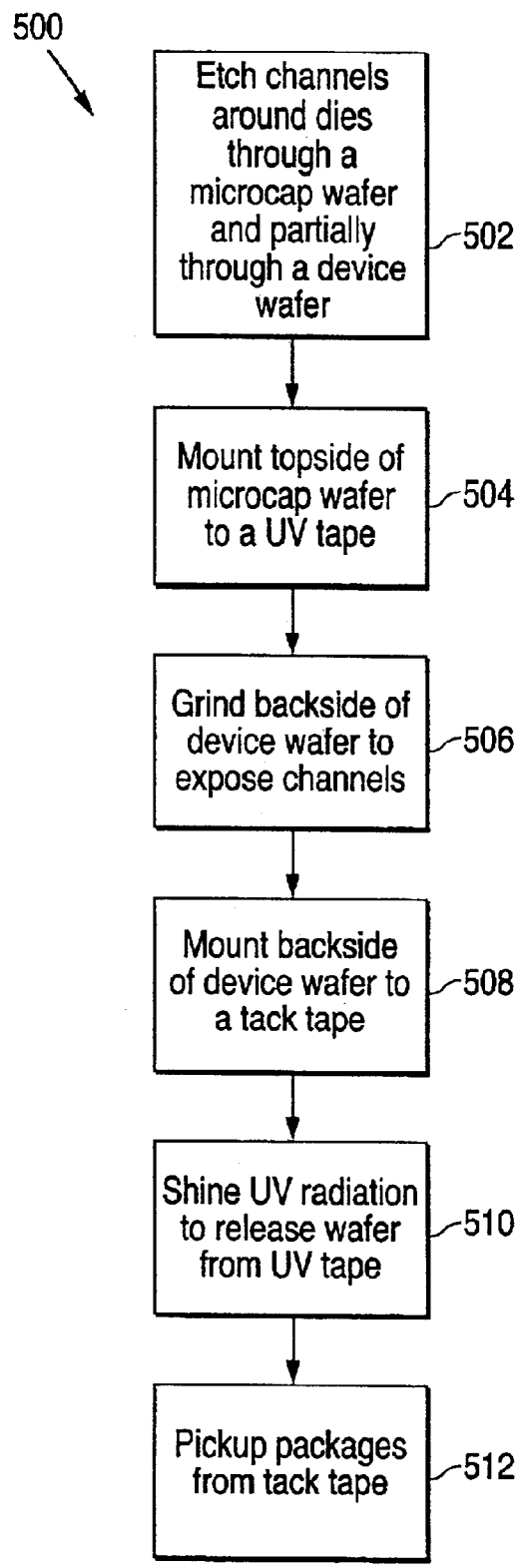
FIG. 5 illustrates a method to separate microcap wafer-level packages on a wafer structure in another embodiment of the invention.
Figure 6A:
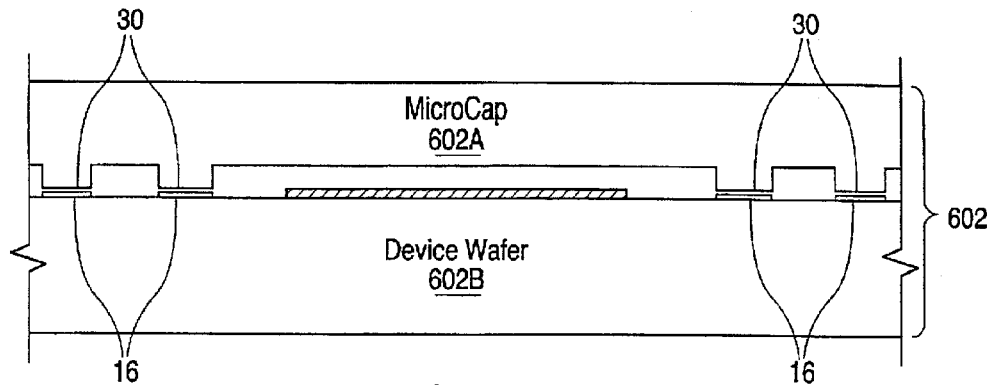
FIGS. 6A, 6B, 6C, 6D, 6E, and 6F illustrate cross-sections of a wafer structure being singulated by the method of FIG. 5.

FIG. 5 illustrates a method 500 to separate dies, such as microcap wafer-level packages, on a wafer structure in another embodiment of the invention. Method 500 starts with a wafer structure 602 consisting of microcap wafer 602A and device wafer 602B bonded together as shown partially in FIG. 6A. Specifically, gasket 30 on microcap wafer 602A are bonded with peripheral pads 16 on device wafer 602B.

Figure 6B:
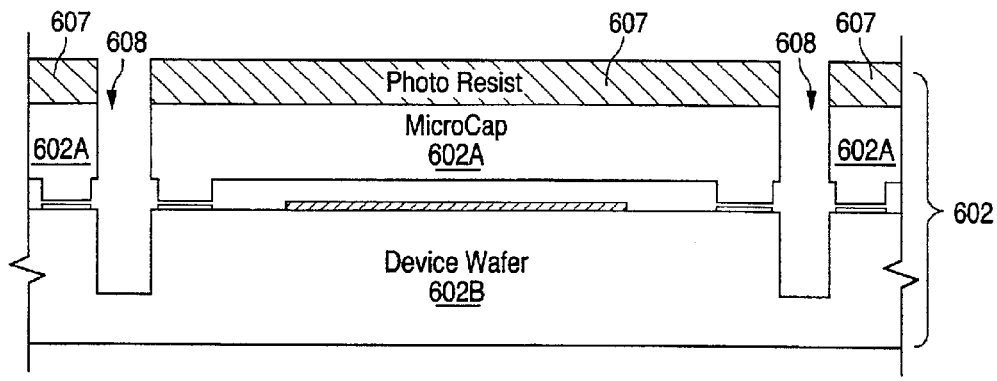

In action 502, channels 608 are formed around the packages in wafer structure 602 as shown in FIG. 6B. Specifically, channels 608 are formed by etching completely through microcap wafer 602A and etching partially through device wafer 602B. In one embodiment, channels 608 are defined by photoresist 607 and then formed by DRIE using the "Bosch process." The width and depth of channels 608 can be varied to suit the application. In one embodiment, the width of a channel 608 between adjacent dies ranges from 10 to 20 microns. After channels 608 are etched, photoresist 607 is removed.

Figure 6C:
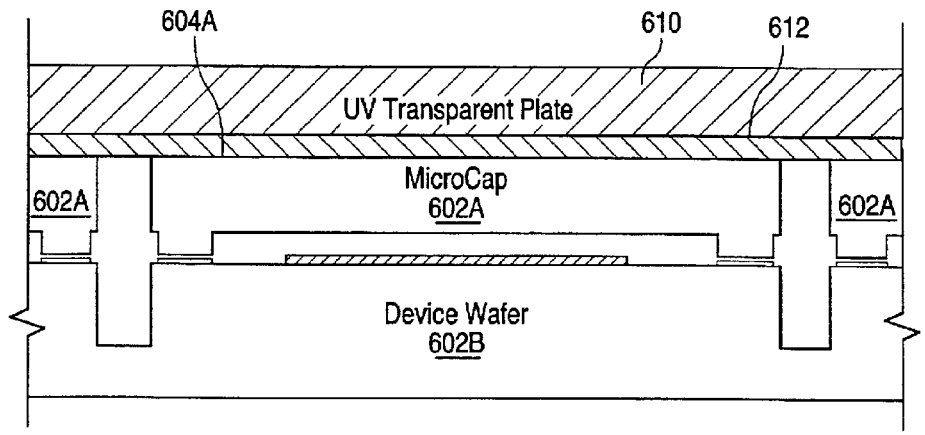

In action 504, topside 604A of microcap wafer 602A is mounted to a UV transparent plate 610 by an adhesive 612 as shown in FIG. 6C. Plate 610 is used to handle and support packages 614 for further processing. In one embodiment, plate 610 is a quartz plate and adhesive 612 is a conventional UV-releasable adhesive or UV-releasable tape.

Figure 6D:
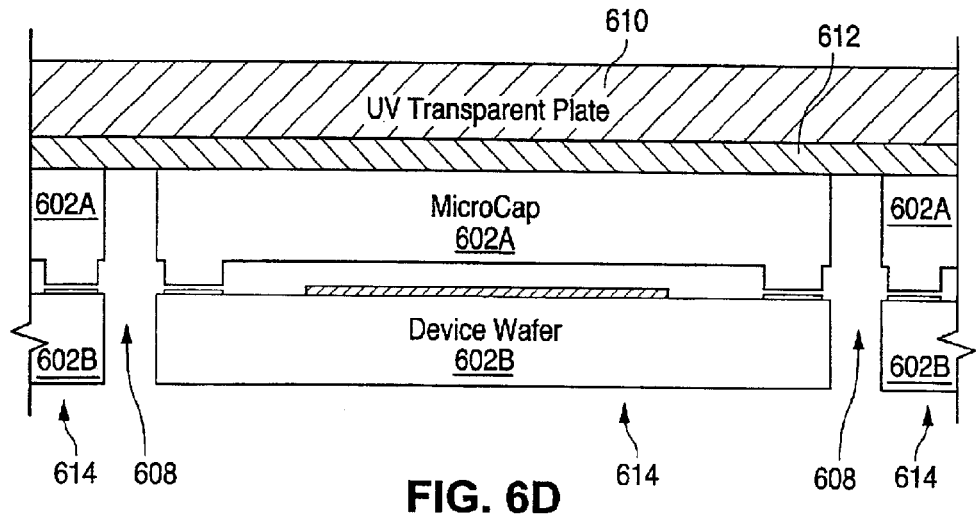

In action 506, the material from backside 606B of device wafer 602B is removed to expose channels 608 on backside 606B as shown in FIG. 6D. Once channels 608 are exposed on backside 606B, packages 614 are separated but held together by adhesive 612 on plate 610. In one embodiment, conventional mechanical grinding is used to remove material from backside 606B to a depth that exposes channels 608. Plate 610 and adhesive 612 provide the proper support during the grinding process.

Figure 6E:
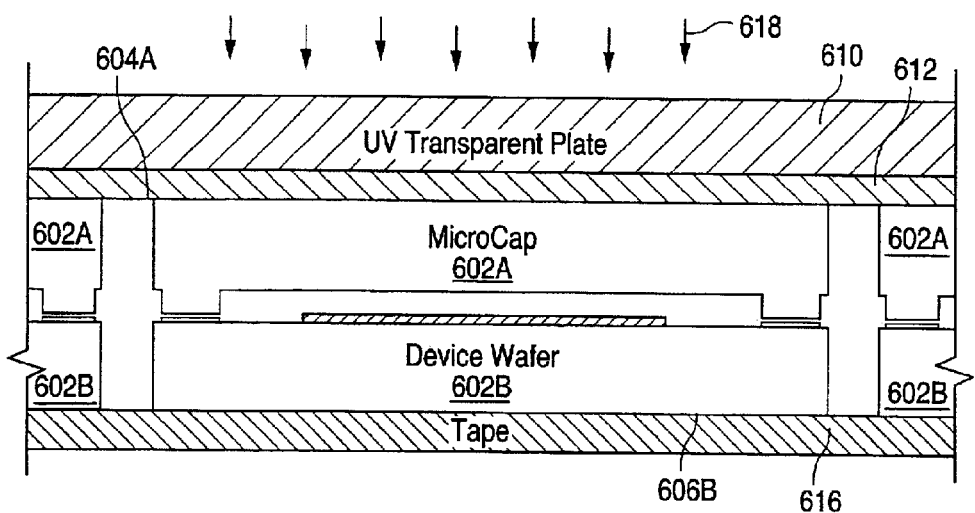

In action 508, backside 606B of wafer 602B is mounted to a tape 616 as shown in FIG. 6E. In one embodiment, tape 616 is a conventional tack tape.

Figure 6F:
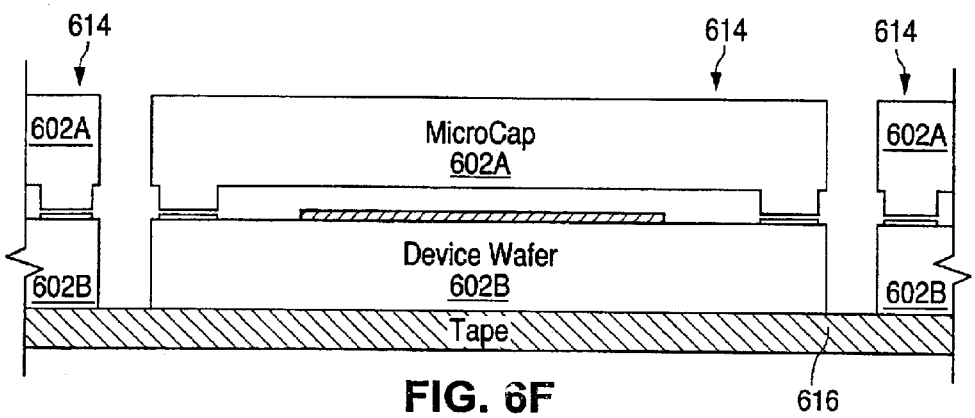

In action 510, topside 604A of microcap wafer 602A is exposed to UV radiation 618 as shown in FIG. 6E. UV radiation 618 passes through plate 610 and causes adhesive 612 to loose its adhesion to topside 604A of microcap wafer 602A. As shown in FIG. 6F, packages 614 become released from plate 610 but are held together by tape 616.

In action 512, packages 614 are picked up from tape 616. In one embodiment, tape 616 is stretched to increase the space between packages 614. Eject pins push up through tape 616 to elevate and loosen packages 614 from tape 616. A vacuum driven pickup device then retrieves packages 614 and deposits them in a carrier.

Various other adaptations and combinations of features of the embodiments disclosed are within the scope of the invention. For example, in the embodiments of method 300 and 500, the top and bottom arrangement of microcap and device wafers can be reversed. Furthermore, in embodiments of method 100, the wafer can be mounted to a tack tape instead of a UV tape in action 104 and the dies can be directly picked up from the tack tape after the backside of the wafer is grinded in action 106. Numerous embodiments are encompassed by the following claims.

What is claimed is:

1. A method for separating dies on a wafer structure, comprising:
    forming channels around the dies on a first side of the wafer structure;
    mounting the first side of the wafer structure to a first adhesive;
    removing material from a second side of the wafer structure until the channels are exposed on the second side of the wafer structure, wherein the dies are separated but held together by the first adhesive;
    mounting the second side of the wafer structure to a second adhesive;
    dismounting the first side of the wafer structure from the transparent plate, wherein the dies are held together by the second adhesive; and
    picking up the dies from the second adhesive.

2. The method of claim 1, wherein said forming comprises etching the channels in the wafer structure.

3. The method of claim 1, wherein said removing comprises grinding the second side of the wafer structure.

4. The method of claim 1, wherein the first adhesive comprises a UV releasable adhesive or a UV releasable tape and said dismounting comprises exposing the first adhesive to UV radiation so the first adhesive looses its adhesion to the first side of the wafer structure.

5. The method of claim 4, wherein the first adhesive is mounted to a transparent plate and said dismounting comprises exposing UV radiation through the transparent plate to the first adhesive.

6. The method of claim 1, wherein the second adhesive is a tack tape.

7. The method of claim 1, wherein the wafer structure comprises a first wafer and a second wafer.

8. The method of claim 7, wherein the dies comprise microcap wafer-level packages.

9. The method of claim 7, wherein said forming comprises etching the channels through the first wafer and partially through the second wafer.

10. A method for separating packages on a wafer structure, comprising:
    forming a first plurality of channels around a first plurality of dies on a backside of a first wafer;
    forming a second plurality of channels around a second plurality of dies on a topside of a second wafer;
    bonding the backside of the first wafer to the topside of the second wafer, wherein the corresponding first plurality of dies and the corresponding second plurality of dies form the respective packages; and
    removing material from a topside of the first wafer until the first plurality of channels is exposed on the topside of the first wafer.

11. The method of claim 10, wherein said forming a first plurality of channels comprises etching the first plurality of channels.

12. The method of claim 10, wherein said forming a second plurality of channels comprises etching the second plurality of channels.

13. The method of claim 10, wherein said removing materials from a topside of the first wafer comprises grinding the topside of the first wafer.

14. The method of claim 10, further comprising:
    mounting the topside of the first wafer to a first adhesive; and
    removing material from a backside of the second wafer until the second plurality of channels is exposed on the backside of the second wafer, wherein the packages are separated but held together by the first adhesive.

15. The method of claim 14, wherein said removing material from a backside of the second wafer comprises grinding the backside of the second wafer.

16. The method of claim 14, further comprising:
    mounting the backside of the second wafer to a second adhesive;
    dismounting the topside of the first wafer from the transparent plate; and
    picking up the packages from the second adhesive.

17. The method of claim 16, wherein the first adhesive comprises a UV releasable adhesive or a UV releasable tape and said dismounting comprises exposing the first adhesive to UV radiation so the first adhesive looses its adhesion so the packages are held together by the second adhesive.

18. The method of claim 17, wherein the first adhesive is mounted to a transparent plate and said dismounting comprises exposing UV radiation through the transparent plate to the first adhesive.

19. The method of claim 16, wherein the second adhesive is a tack tape.

* * * * *